US009983259B2

(12) United States Patent
Wu et al.

(10) Patent No.: US 9,983,259 B2
(45) Date of Patent: May 29, 2018

(54) DUAL LOOP TYPE TEMPERATURE CONTROL MODULE AND ELECTRONIC DEVICE TESTING APPARATUS PROVIDED WITH THE SAME

(71) Applicant: CHROMA ATE INC., Taoyuan County (TW)

(72) Inventors: Xin-Yi Wu, Taoyuan County (TW); Chien-Hung Lo, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 0 days. days.

(21) Appl. No.: 15/420,154

(22) Filed: Jan. 31, 2017

(65) Prior Publication Data

US 2017/0227599 A1 Aug. 10, 2017

(30) Foreign Application Priority Data

Feb. 5, 2016 (TW) .............................. 105103932 A

(51) Int. Cl.
*G01R 31/00* (2006.01)
*G01R 31/28* (2006.01)
(Continued)

(52) U.S. Cl.
CPC ......... *G01R 31/2875* (2013.01); *F28D 15/00* (2013.01); *G01R 31/2877* (2013.01);
(Continued)

(58) Field of Classification Search
CPC ............ G01R 31/2875; G01R 31/2877; G01R 31/2862; G01R 31/2867; F25B 21/02;
(Continued)

(56) References Cited

U.S. PATENT DOCUMENTS 4,734,872 A 3/1988 Eager et al.
5,205,132 A 4/1993 Fu
(Continued)

FOREIGN PATENT DOCUMENTS

WO 9934644 A1 7/1999

OTHER PUBLICATIONS

TW Office Action dated Oct. 7, 2016 in corresponding Taiwan application (No. 105103932).

*Primary Examiner* — Thang Le
(74) *Attorney, Agent, or Firm* — McClure, Qualey & Rodack, LLP

(57) ABSTRACT

A dual loop type temperature control module and an electronic device testing apparatus having the same are provided. The temperature control module comprises a first loop through which a first working fluid of a first temperature flows, a second loop through which a second working fluid of a second temperature flows, a controller for controlling a first switching valve such that the first or second working fluid flows through a temperature regulating device, and a second switching valve such that the working fluid flowing through the temperature regulating device returns to the first or second loop. The temperature regulating device adjusts a thermoelectric cooling device to reach two different reference temperatures based on the rise/fall of its temperature dependent on the working fluid. The thermoelectric cooling device regulates the temperature of the tested object under a wide range of temperature difference and with accuracy based on the reference temperatures to facilitate the detection of high/low temperature.

10 Claims, 6 Drawing Sheets

(51) Int. Cl.
*F28D 15/00* (2006.01)
*G05D 23/19* (2006.01)
*F25B 21/04* (2006.01)

(52) U.S. Cl.
CPC .............. *G05D 23/19* (2013.01); *F25B 21/04* (2013.01); *F25B 2321/021* (2013.01); *F25B 2321/0212* (2013.01); *F25B 2321/0252* (2013.01)

(58) Field of Classification Search
CPC ................ F25B 21/04; F25B 2321/021; F25B 2321/0252; F25B 2321/0212; F25B 2321/0251; H01L 21/67109; H01L 21/67248; H01L 21/6831; F04B 19/24; F04B 23/02; F05B 2700/2102; G05D 23/19; F04D 29/58; F04D 29/582
See application file for complete search history.

(56) References Cited

U.S. PATENT DOCUMENTS

| | | |
|---|---|---|
| 2002/0062954 A1 | 5/2002 | Getchel et al. |
| 2004/0035851 A1 | 2/2004 | Antoniou et al. |
| 2011/0107772 A1* | 5/2011 | Goenka ............. B60H 1/00478 62/3.3 |
| 2012/0073309 A1* | 3/2012 | Hung ...................... F25B 21/02 62/3.3 |
| 2014/0062513 A1 | 3/2014 | Johnson et al. |
| 2015/0007973 A1 | 1/2015 | Yu et al. |
| 2015/0114616 A1* | 4/2015 | Lin .................... H05K 7/20781 165/287 |
| 2016/0172219 A1* | 6/2016 | Han ....................... F25B 21/02 62/3.2 |

\* cited by examiner

//DUAL LOOP TYPE TEMPERATURE CONTROL MODULE AND ELECTRONIC DEVICE TESTING APPARATUS PROVIDED WITH THE SAME

FIELD OF THE INVENTION

The invention is related to a dual loop type temperature control module and electronic device testing apparatus provided with the same, particularly to a temperature control module and electronic device testing apparatus capable of switching high/low detection temperature rapidly and significantly.

DESCRIPTIONS OF THE RELATED ART

In existing art, there are few technologies that may provide a wide range of temperature detection, for example, conducting low and high temperature tests simultaneously, for electronic device detection apparatus.

US patent publication No. 2015/0007973 A1 entitled "Wide Range of Temperature Control Equipment" discloses using a thermoelectric cooling module to regulate the temperature, a thermal conducting plate to provide the thermoelectric cooling module with a reference temperature so that the thermoelectric cooling module may perform temperature regulation with better accuracy and wider range based on the reference temperature. The afore-mentioned patent publication makes use of a heating unit and a cooling assembly to regulate the reference temperature of the thermal conducting plate. The heating unit is a heating coil embedded in the thermal conducting plate, while the cooling assembly is an additional cooling apparatus, such as one composed of an evaporator, a compressor and a condenser, provided on the thermal conducting plate.

In the patent publication mentioned above, during high/low temperature detection, for example, when the thermal conducting plate is at −40° C., and after low temperature test has been made, the thermal conducting plate has to be heated by a heating unit to a high temperature (for example, 80° C.) for the high temperature test. However, the switching process between high and low temperatures is lengthy. Moreover, if all the objects to be tested are arranged to undergo high/low temperature test on the same machine, the thermal conducting plate has to be heated and cooled repetitively. As such, not only the entire test schedule would be delayed, but also the heating unit and cooling apparatus will consume a lot of energy.

SUMMARY OF THE INVENTION

An object of the present invention is to provide a dual loop type temperature control module in order to switch between at least two temperature ranges rapidly, such that a temperature regulating device may switch to different temperatures in very short time, and the energy lost during the switching process is relatively low.

An embodiment of the invention provides a dual loop type temperature control module that includes primarily a first loop, a second loop, a temperature regulating device, a first switching valve, a second switching valve and a controller is provided. A first working fluid of a first temperature flows in the first loop. A second working fluid of a second temperature flows in the second loop. Moreover, the temperature regulating device includes an inlet and an outlet. The first switching valve is connected to the first loop, the second loop, and the inlet of the temperature regulating device. The second switching valve is connected to the first loop, the second loop, and the outlet of the temperature regulating device. The controller is electrically connected to the first switching valve and the second switching valve. Wherein, the controller is configured to control the first switching valve so that at least one of the first and second working fluids flows through the temperature regulating device to regulate the temperature thereof, and to control the second switching valve such that at least one of the first and second working fluids flowing through the temperature regulating device returns to at least one of the first and second loops.

A further object of the invention is to provide an electronic device testing apparatus having a dual loop type temperature control module in order to provide at least two reference temperatures with a wide margin of temperature difference, so that the thermoelectric cooling device can regulate the temperature of the object to be tested under a wide range of temperature difference and with accuracy based on the reference temperatures to facilitate the detection of high/low temperature for the electronic device.

A further embodiment of the invention provides an electronic device testing apparatus having a dual loop type temperature control module according to the invention includes mainly: the dual loop type temperature control module and the thermoelectric cooling device as mentioned above. The thermoelectric cooling device is electrically connected with the controller and arranged to be in contact with the temperature regulating device. The temperature regulating device may be configured to adjust the thermoelectric cooling device to a reference temperature, and the controller may be configured to control the thermoelectric cooling device to regulate the temperature of an object to be tested based on the reference temperature.

DETAILED DESCRIPTION OF THE PREFERRED EMBODIMENTS

Before describing the dual loop type temperature control module and the electronic device testing apparatus having the same according to the invention in the example in detail, it is noted particularly that like elements will be denoted by the same element symbol in the following description. Furthermore, the drawings of the invention are illustrative only and may not be drawn in scale. Moreover, not all details are shown in these drawings.

Figure 1:
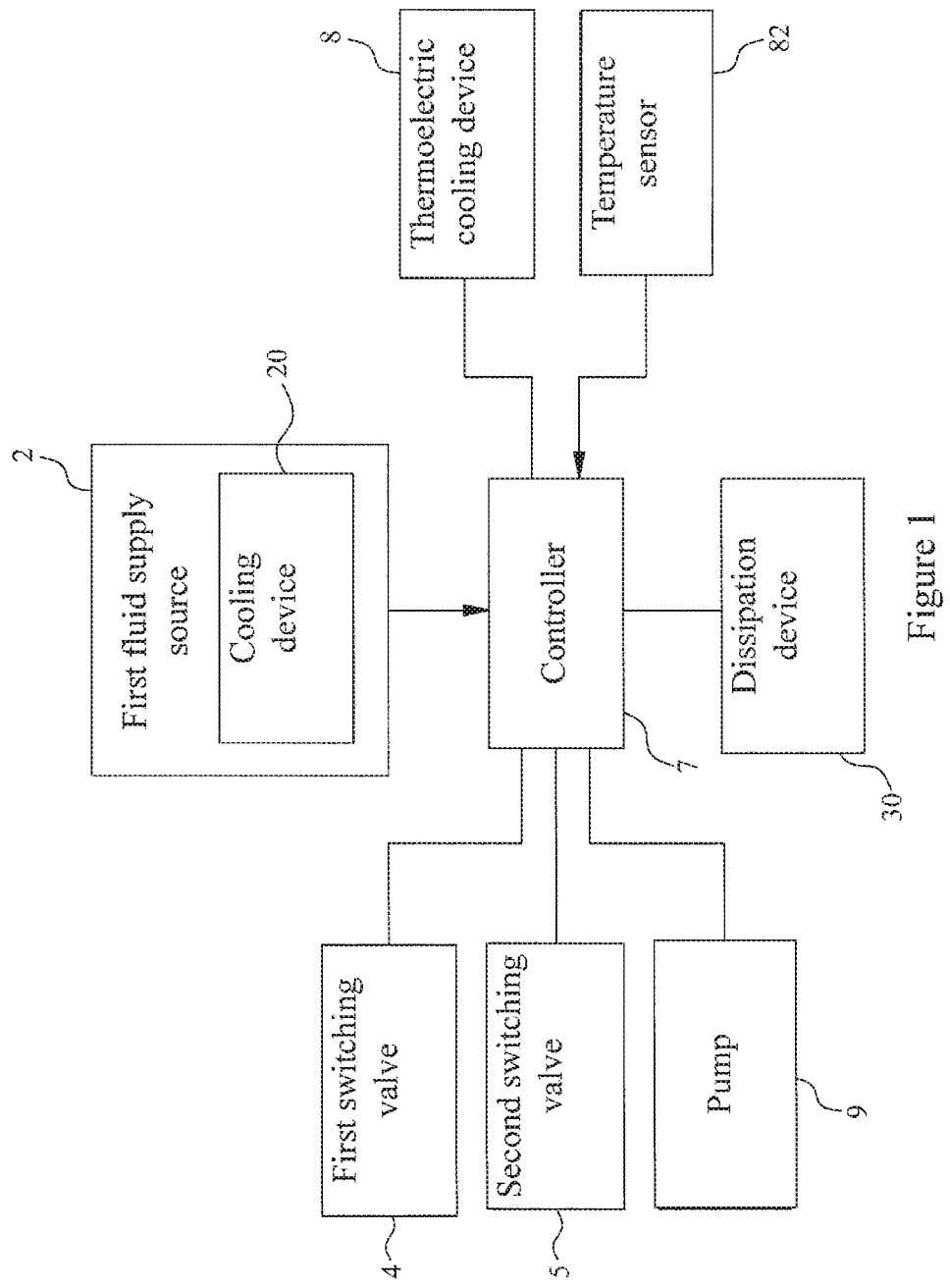
FIG. 1 is a system architecture diagram of a first example according to the invention.
Figure 2:
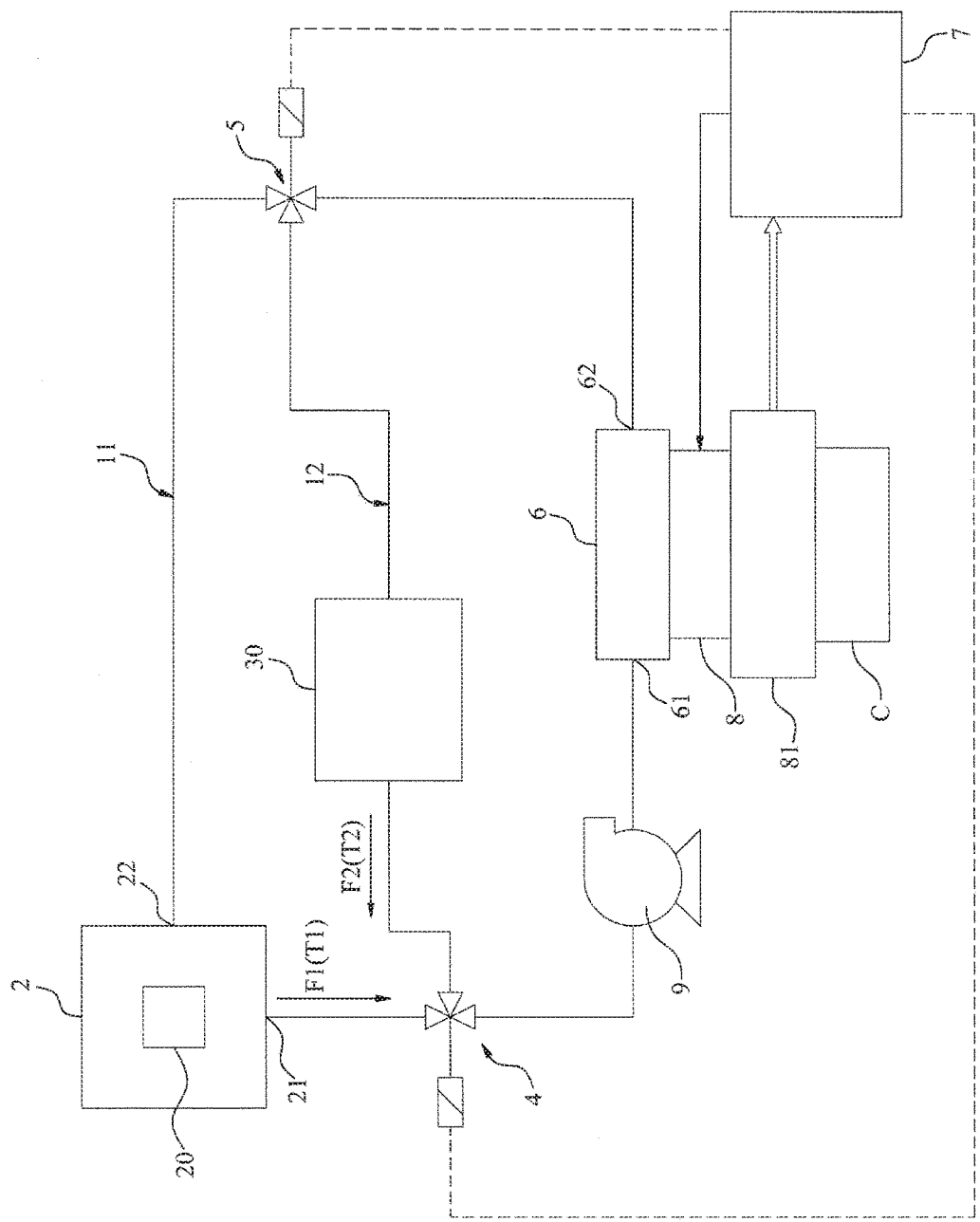
FIG. 2 is a schematic diagram of the first example according to the invention.

Referring to FIGS. 1 and 2, in which FIG. 1 is a system architecture diagram showing a first embodiment of the electronic device testing apparatus having the dual loop type temperature control module according to the invention, and FIG. 2 is a schematic drawing showing the first embodiment of the electronic device testing apparatus having the dual loop type temperature control module according to the invention. As shown in the figures, the dual loop type temperature control module of the embodiment includes primarily a first loop 11, a second loop 12, a first fluid supply source 2, a heat dissipation device 30, a first switching valve 4, a second switching valve 5, a temperature regulating device 6 and a controller 7.

A first working fluid F1 of a first temperature T1 is supplied by the first fluid supply source 2 and flows in the first loop 11 The first fluid supply source 2 includes a cooling device 20 for cooling the first working fluid F1, so as to maintain the first working fluid F1 at a first temperature T1. The cooling device 20 according to this embodiment can be formed of a conventional fluid cooling apparatus, such as a compressor, condenser, expansion valve or evaporator.

In particular, the first fluid supply source 2 provides the first working fluid F1 in low temperature to conduct a low temperature test. Additionally, the first fluid supply source 2 includes a first supply port 21 and a first back-flow port 22. That is, the first working fluid F1 in the first loop 11 flows out of the first supply port 21, and returns to the first fluid supply source 2 through the first back-flow port 22, thereby completes a circulation.

Furthermore, a second working fluid F2 of a second temperature T2 flows within the second loop 12. A heat dissipation device 30 is installed in the second loop 12 for heat dissipation of the second working fluid F2, so as to maintain the second working fluid F2 at a second temperature T2. The heat dissipation device 30 can be an air cooled, water-cooled or any other radiator that is capable of heat exchanging with the air at normal temperature. In other words, the heat dissipation device 30 of this embodiment may provide the first working fluid F1 at normal temperature.

The first and second working fluid F1, F2 may be average solutions that are resistant to low temperature, such as conventional nonfreezing solutions, and some examples of which are methanol, ethanol, ethylene glycol, propyl alcohol, or propylene glycol; or may be mixtures of water, anti-freeze solutions, and additives. The cooling fluid may be classified into alcohol based, glycerin based or ethylene glycol based in accordance with the compositions of the anti-freeze solutions. In the ethylene glycol cooling liquid, ethylene glycol is used as the anti-freeze solution, and a small amount of antifoaming additives and anti-corrosion additives are added.

The temperature regulating device 6, which is the target to be regulated in the dual loop type temperature control module according to the present invention, includes an inlet 61 and an outlet 62. In this embodiment, the temperature regulating device 6 comprises a serpentine channel (not shown) having one end as the inlet 61 and other end as the outlet 62. However, the invention is not limited to the serpentine channel, and a tubular channel, or any other heat exchanger attached to or embedded in the temperature regulating device 6 can also be used.

Further, as shown in the figures, the first switching valve 4 and the second switching valve 5 are formed of three-way solenoid valves which may be regulated by the controller 7. The first switching valve 4 is connected to the first supply port 21 of the first fluid supply source 2, the heat dissipation device 30, and the inlet 61 of the temperature regulating device 6. The second switching valve 5 is connected to the first back-flow port 22 of the first fluid supply source 2, the heat dissipation device 30, and the outlet 62 of the temperature regulating device 6.

Moreover, as shown in the figures, pump 9 is arranged between the first switching valve 4 and the temperature regulating device 6, and is electrically connected to the controller 7. In other words, the controller 7 may control the operation of the pump 9, so that the pump 9 may force the first or second working fluid, F1 or F2, to flow and circulate in the loop.

The controller 7 of this embodiment is further electrically connected to the first and second switching valve 4, 5. The controller 7 can control the first switching valve 4 to enable the first or second working fluid F1, F2 to flow through the temperature regulating device 6 to thereby regulate the temperature of the temperature regulating device 6, and control the second switching valve 5 to enable the first or second working fluid F1, F2 flowing through the temperature regulating device 6 to return to the first or second loop 11, 12.

Further, as shown in FIGS. 1 and 2, besides the dual loop type temperature control module as mentioned hereinbefore, the electronic device testing apparatus according to the present invention further comprises a thermoelectric cooling device 8 (Thermo-Electric Cooler, TEC), a testing fixture 81, a temperature sensor 82 and the pump 9. The thermoelectric cooling device 8 is electrically connected with the controller 7 and in direct contact with the temperature regulating device 6. The temperature regulating device 6 of this embodiment is configured to adjust the thermoelectric cooling device 8 to a reference temperature, and the controller 7 is configured to control the thermoelectric cooling device 8 to regulate the temperature of an object to be tested C within a wider range and with better accuracy based on the reference temperature.

The operation theory of the thermoelectric cooling device 8 according to this embodiment is based on Peltier Effect. This effect is a thermoelectric effect, in which the transfer of heat from one side of the device to the other side will result in the fall of the temperature at one side and the rise of the temperature at the other side. That is, one side absorbs heat, and the other side dissipates heat. Generally, the thermoelectric cooling device 8 is structured by arranging a number of pairs of N type and P type semiconductor chips in series. When the power is supplied, P type semiconductor will absorb heat, while N type semiconductor will dissipate heat. As such, in each N/P unit, heat is delivered from one side, the "heat absorption end", to the other side, the "heat dissipation end", thereby achieving heat transfer. In this embodiment according to the invention, when high temperature or low temperature test is to be conducted, the temperature regulating device 6 regulates the thermoelectric cooling device 8 to a reference temperature, and continuously removes heat from or provides heat to the thermoelectric cooling device 8 so as to maintain at the reference temperature.

The testing fixture 81 is configured to carry the object to be tested C, for example, a test socket. The thermoelectric cooling device 8 is attached to the testing fixture 81 directly so as to be able to raise or lower the temperature of the testing fixture 81 to establish a detection environment under a specific temperature (for example, high, normal or low temperature) for testing the object to be tested C. Moreover, a temperature sensor 82 electrically connected to the controller 7 is further provided. The temperature sensor 82 is provided to measure the temperature of the testing fixture 81. That is to say, in this embodiment, the controller 7 may precisely control the temperature of the thermoelectric cooling device 8 based on the feedback of the temperature measurement from the temperature sensor 82.

In this embodiment, the controller 7 is responsible for controlling all the electronic devices, which include the first switching valve 4, second switching valve 5, cooling device 20, thermoelectric cooling device 8 and pump 9, and for controlling the test of the object to be tested C. However, the present invention shall not be limited thereto. It is to be noted that different components may have respective controllers. For example, the controller of the cooling device 20 is designed to control exclusively the operation of the cooling device, so as to maintain the first working fluid F1 at the first temperature T1.

Figure 3A:
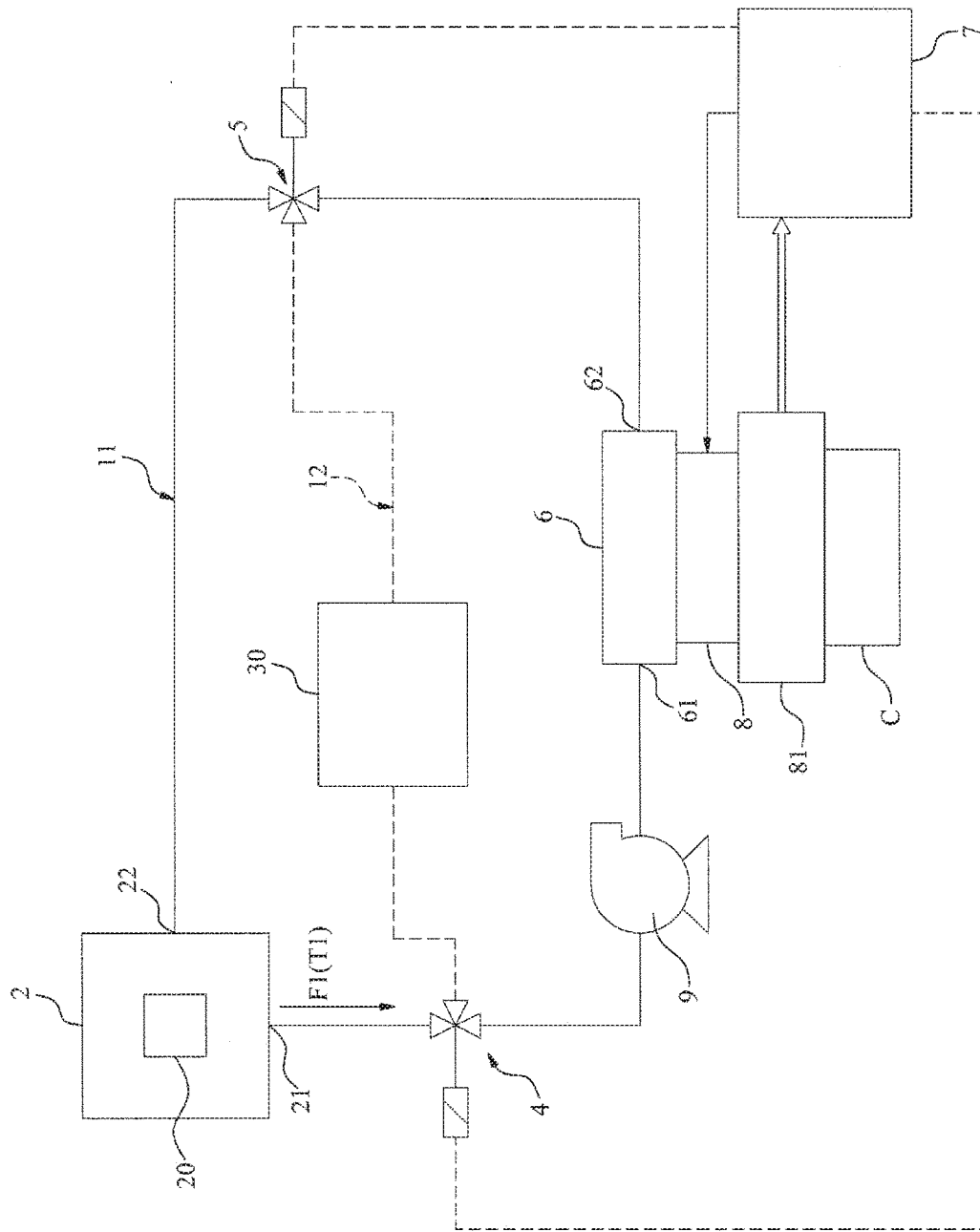
FIG. 3A is a schematic diagram showing operation of a first loop in the first example according to the invention.
Figure 3B:
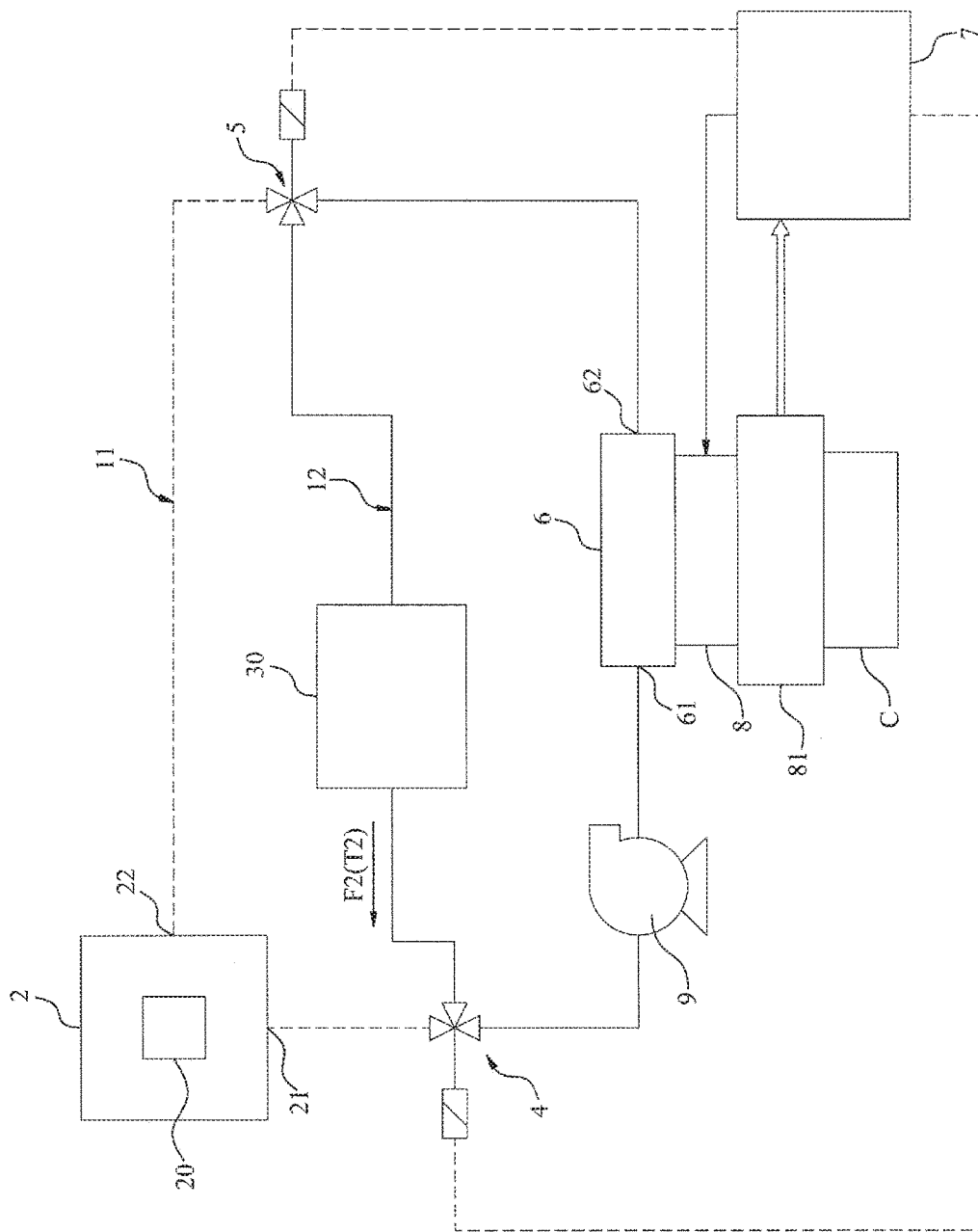
FIG. 3B is a schematic diagram showing operation of a second loop in the first example according to the invention.

Referring to FIGS. 3A and 3B, in which FIG. 3A is a schematic diagram showing the operation of the first loop 11 in the first embodiment according to the invention, and FIG. 3B is a schematic diagram showing the operation of the second loop 12 in the first embodiment according to the invention. The operation of this embodiment is described hereinafter. Firstly, an operation regarding low temperature test shall be described. The controller 7 is designed to control the closing of the second loop 12. That is, the first switching valve 4 and the second switching valve 5 close their respective flow paths to the heat dissipation device 30, and open the flows paths to the first supply port 21 and first back-flow port 22 of the first fluid supply source 2, thereby forming a circulation loop, as shown in FIG. 3A.

As the first working fluid F1 in the first loop 11 is cooled by the cooling device 20, it has a low temperature. In this embodiment, −20° C. is taken as an example of the low temperature of the first working fluid F1. Accordingly, when the first working fluid F1 with a low temperature flows through the temperature regulating device 6, it cools the temperature regulating device 6 and maintains the temperature regulating device 6 at −20° C. A reference temperature of −20° C. can then be provided to the thermoelectric cooling device 8. However, according to the property of the thermoelectric cooling device 8, a regulation of the reference temperature in the range of −40° C. to +80° C. may be performed for the thermoelectric cooling device 8. In other words, the range of temperature that may be controlled accurately is from −60° C. to 60° C.

After the object to be tested C has completed the low temperature test, it is subjected to a high temperature test. In the test, the controller 7 controls the closing of the first loop 11. That is, the first and second switching valve 4, 5 close their respective flow paths to the first fluid supply source 2, and open the flow paths to the heat dissipation device 30, thereby forming a circulation loop, as shown in FIG. 3B.

When the second working fluid F2 in the second loop 12 flows through the temperature regulating device 6, it raises the temperature of the temperature regulating device 6 which is at low temperature after cooling by the first loop 11 to a normal temperature rapidly. The temperature of the temperature regulating device 6 can be maintained at the normal temperature continuously through operation of the heat dissipation device 30. In this embodiment, 25° C. is taken as an example of the normal temperature. Accordingly, when the second working fluid F2 with a low temperature flows through the temperature regulating device 6, the temperature regulating device 6 is maintained at 25° C. Accordingly, the second loop 12 may provide a reference temperature of 25° C. for the thermoelectric cooling device 8. In other words, with this loop, the controller 7 can precisely regulate the test temperature in the range from −15° C. to 105° C.

In this embodiment, the test temperatures for high and low temperatures are −40° C. and 85° C., respectively. When the first loop 11 is switched to the second loop 12, that is, as the temperature is increased from the −40° C. for low temperature test to the 85° C. for high temperature test, it takes only about 64 seconds in the actual test. In other words, the temperature rises rapidly at a rate of about 2° C. per second in the entire heating process. On the other hand, when the second loop 12 is switched to the first loop 11, that is, as the temperature is decreased from the 85° C. for high temperature test to the −40° C. for low temperature test, it takes only about 117 seconds in the actual test. In other words, the temperature falls rapidly at a rate of more than 1° C. per second in the entire cooling process. Accordingly, it is obvious that high and low temperature tests may be switched rapidly or performed on the same machine rather than on the different machines for the test. Further, waiting time for the rise or fall of the temperature is considerably shortened, and the loss of energy is reduced tremendously.

Figure 4:
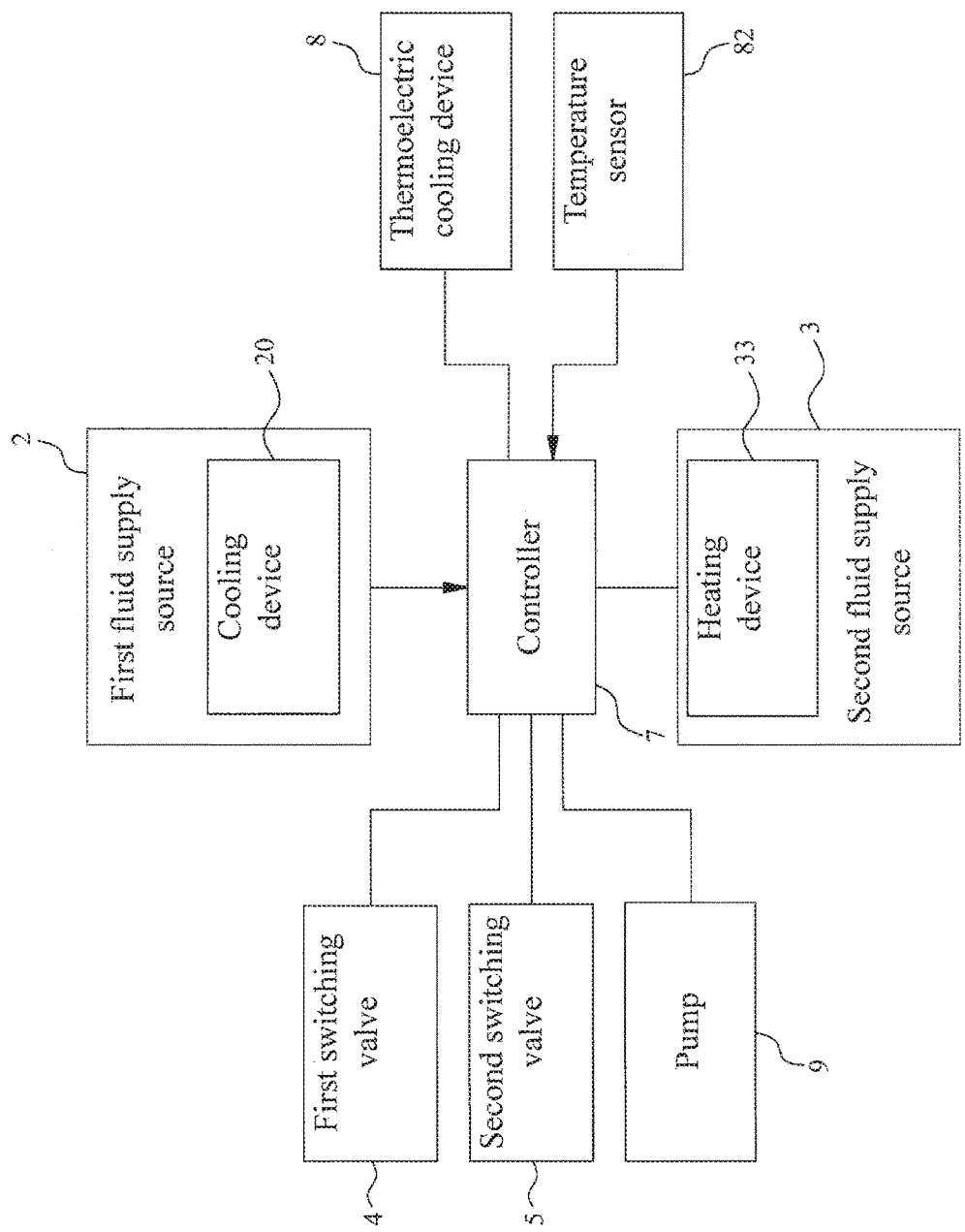
FIG. 4 is a system architecture diagram of a second example according to the invention.
Figure 5:
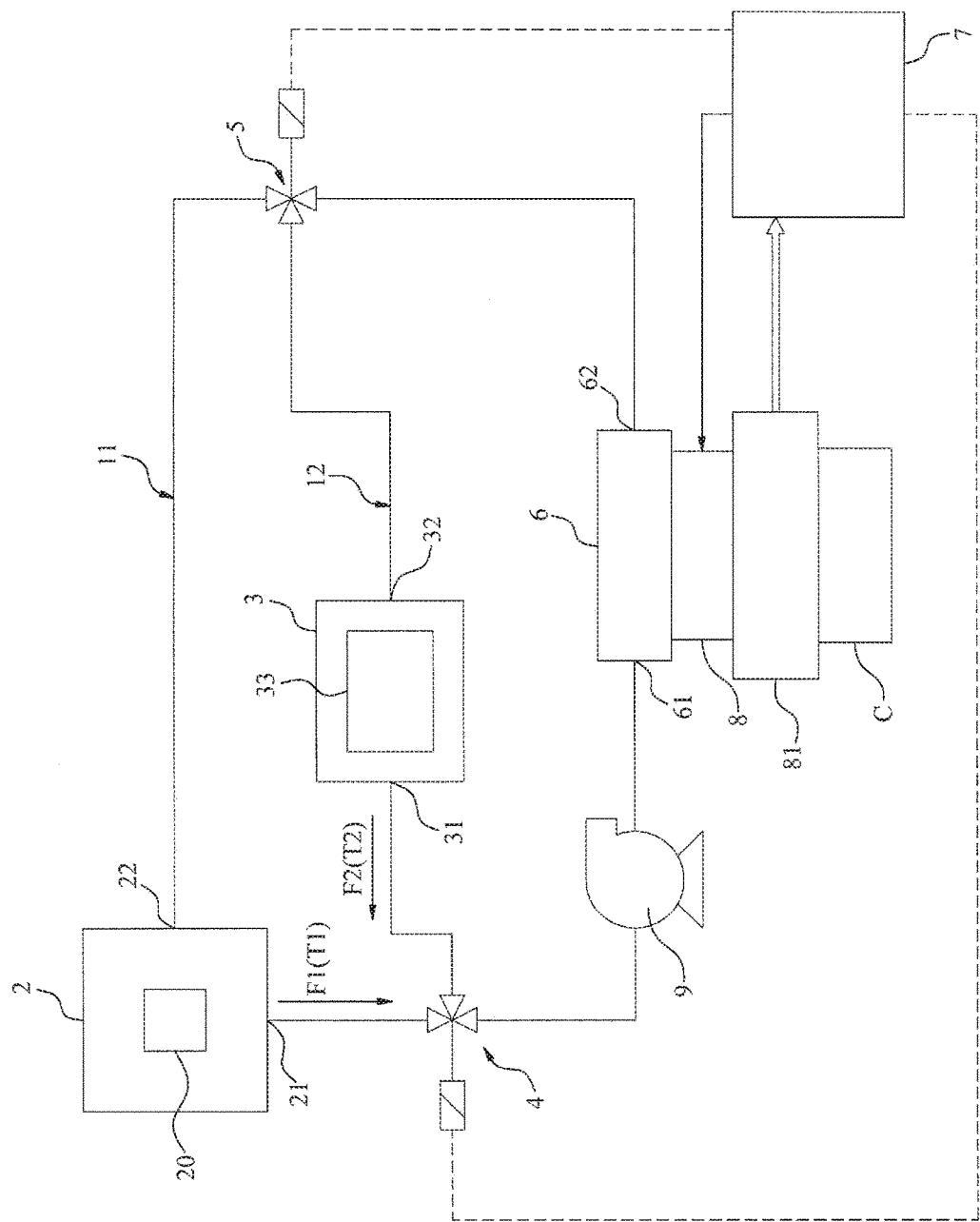
FIG. 5 is a schematic diagram of the second example according to the invention.

Referring to FIGS. 4 and 5, in which FIG. 4 is a system architecture diagram showing a second embodiment of the electronic device testing apparatus having the dual loop type temperature control module according to the invention, and FIG. 5 is a schematic diagram showing the second embodiment of the electronic device testing apparatus having the dual loop type temperature control module according to the invention. The present embodiment differs from the first embodiment as mentioned above in that the present embodiment provides a high temperature test with an even higher temperature.

As shown in the figures, in the present embodiment, the heating device 30 that provides working fluid at normal temperature in the first embodiment is replaced with a second fluid supply source 3 having a heating device 33 therein. The second fluid supply source 3 includes a second supply port 31 and a second back-flow port 32. The second working fluid F2 in the second loop 12 flows out of the second supply port 31, and returns to the second fluid supply source 3 through the second back-flow port 32, thereby completes a circulation.

In the present embodiment, the second fluid supply source 3 provides a working fluid with higher and more stable temperature. As to the heating device 33, it is configured to heat the second working fluid F2 so as to provide the thermoelectric cooling device 8 with an even higher reference temperature, whereby a test environment under a higher temperature may be established by the thermoelectric cooling device 8.

While the preferred embodiments have been described as above, it is to be noted that the description and accompanying drawings disclosed herein are not intend to restrict the scope of implementation of the present invention. Variations and modifications equivalent to the above embodiments and able to be realized are considered to be within the scope of the present invention.

The invention claimed is:

1. A dual loop type temperature control module, comprising:
    a first loop through which a first working fluid of a first temperature flows;
    a second loop through which a second working fluid of a second temperature flows;
    a temperature regulating device having an inlet and an outlet;
    a first switching valve connecting with the first loop, the second loop, and the inlet of the temperature regulating device;
    a second switching valve connecting with the first loop, the second loop, and the outlet of the temperature regulating device; and a controller electrically connected with the first switching valve and the second switching valve;

wherein the controller is configured to control the first switching valve so that at least one of the first and second working fluid flows through the temperature regulating device to regulate the temperature thereof, and to control the second switching valve such that at least one of the first and second working fluid flowing through the temperature regulating device returns to at least one of the first and second loop.

2. The dual loop type temperature control module of claim 1, further comprising a cooling device arranged in the first loop for cooling the first working fluid.

3. The dual loop type temperature control module of claim 2, wherein the first loop further comprises a first fluid supply source for supplying the first working fluid of the first temperature, the first fluid supply source includes a first supply port and a first back-flow port; the cooling device is disposed at the first fluid supply source; the first switching valve is connected to the first supply port of the first fluid supply source, and the second switching valve is connected to the first back-flow port of the first fluid supply source.

4. The dual loop type temperature control module of claim 1, further comprising a heat dissipation device disposed in the second loop for heat dissipation of the second working fluid.

5. The dual loop type temperature control module of claim 1, further comprising a heating device disposed in the second loop for heating the second working fluid.

6. The dual loop type temperature control module of claim 5, wherein the second loop further includes a second fluid supply source for supplying the second working fluid of the second temperature, the second fluid supply source includes a second supply port and a second back-flow port; the heating device is disposed at the second fluid supply source; the first switching valve is connected to the second supply port of the second fluid supply source, and the second switching valve is connected to the second back-flow port of the first fluid supply source.

7. The dual loop type temperature control module of claim 1, further comprising a pump electrically connected to the controller and disposed between the first switching valve and the temperature regulating device.

8. An electronic device testing apparatus, comprising:
a dual loop type temperature control module comprising:
a first loop through which a first working fluid of a first temperature flows;
a second loop through which a second working fluid of a second temperature flows;
a temperature regulating device having an inlet and an outlet;
a first switching valve connecting with the first loop, the second loop, and the inlet of the temperature regulating device;
a second switching valve connecting with the first loop, the second loop, and the outlet of the temperature regulating device; and
a controller electrically connected with the first switching valve and the second switching valve; and
a thermoelectric cooling device electrically connected with the controller and arranged to be in contact with the temperature regulating device;
wherein the controller is configured to control the first switching valve and the second switching valve so that at least one of the first and second working fluid flows through the temperature regulating device to regulate a reference temperature, and the controller is configured to control the thermoelectric cooling device to regulate the temperature of an object to be tested based on the reference temperature.

9. The electronic device testing apparatus of claim 8, further comprising a testing fixture for carrying the object to be tested, the testing fixture being arranged to be in contact with the thermoelectric cooling device.

10. The electronic device testing apparatus of claim 9, further comprising a temperature sensor electrically connected to the controller for measuring the temperature of the testing fixture.

* * * * *